(12) United States Patent
Yasui et al.

(10) Patent No.: US 10,219,393 B2
(45) Date of Patent: Feb. 26, 2019

(54) ELECTRONIC DEVICE

(71) Applicant: Toshiba Client Solutions CO., LTD., Koto-ku, Tokyo (JP)

(72) Inventors: Satoru Yasui, Tokyo (JP); Masaya Hirashima, Tokyo (JP); Takahiro Sakaguchi, Tokyo (JP); Tsuyoshi Kozai, Tokyo (JP)

(73) Assignees: KABUSHIKI KAISHA TOSHIBA, Tokyo (JP); TOSHIBA CLIENT SOLUTIONS CO., LTD., Tokyo (JP)

( * ) Notice: Subject to any disclaimer, the term of this patent is extended or adjusted under 35 U.S.C. 154(b) by 0 days.

(21) Appl. No.: 15/836,613

(22) Filed: Dec. 8, 2017

(65) Prior Publication Data

US 2018/0279491 A1    Sep. 27, 2018

(30) Foreign Application Priority Data

Mar. 27, 2017 (JP) ................... 2017-061657

(51) Int. Cl.
| | |
|---|---|
| H05K 7/00 | (2006.01) |
| H05K 5/00 | (2006.01) |
| H01R 12/72 | (2011.01) |
| H05K 5/02 | (2006.01) |

(52) U.S. Cl.
CPC ......... *H05K 5/0026* (2013.01); *H01R 12/721* (2013.01); *H05K 5/0017* (2013.01); *H05K 5/0247* (2013.01)

(58) Field of Classification Search
CPC ........................................................ G06F 1/18
USPC ..................................................... 361/679.01
See application file for complete search history.

(56) References Cited

U.S. PATENT DOCUMENTS

| | | | |
|---|---|---|---|
| 2012/0182683 A1* | 7/2012 | Schwandt | G02B 6/4292 |
| | | | 361/679.31 |
| 2016/0070313 A1* | 3/2016 | Wu | G06K 19/07732 |
| | | | 361/679.32 |

FOREIGN PATENT DOCUMENTS

| | | |
|---|---|---|
| JP | 2006-302651 A | 11/2006 |
| JP | 2010-097715 A | 4/2010 |

* cited by examiner

*Primary Examiner* — Jerry Wu
(74) *Attorney, Agent, or Firm* — Knobbe, Martens, Olson & Bear, LLP

(57) ABSTRACT

According to one embodiment, an electronic device includes a housing including a wall portion, a printed circuit board including a plurality of lines and provided in the housing, and a connector formed of a part of the housing and a part of the printed circuit board. The connector includes an engagement hole formed in the wall portion and into which a connector plug is inserted. The connector further includes a shell formed of a portion located around the engagement hole in the wall portion, a tongue portion formed of a part of the printed circuit board and provided in the engagement hole, and connection terminals formed of the lines extending to and on a surface of the tongue portion.

5 Claims, 7 Drawing Sheets

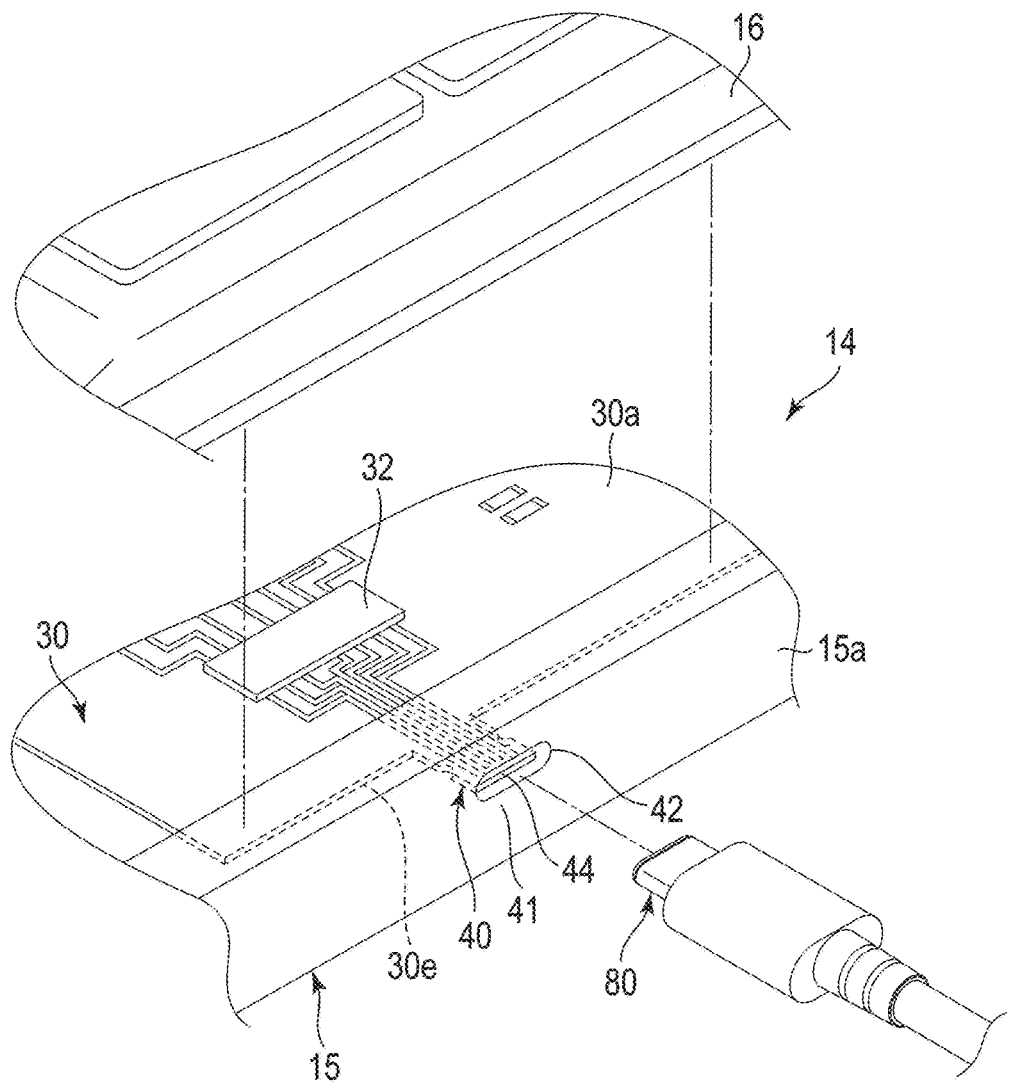
F I G. 2

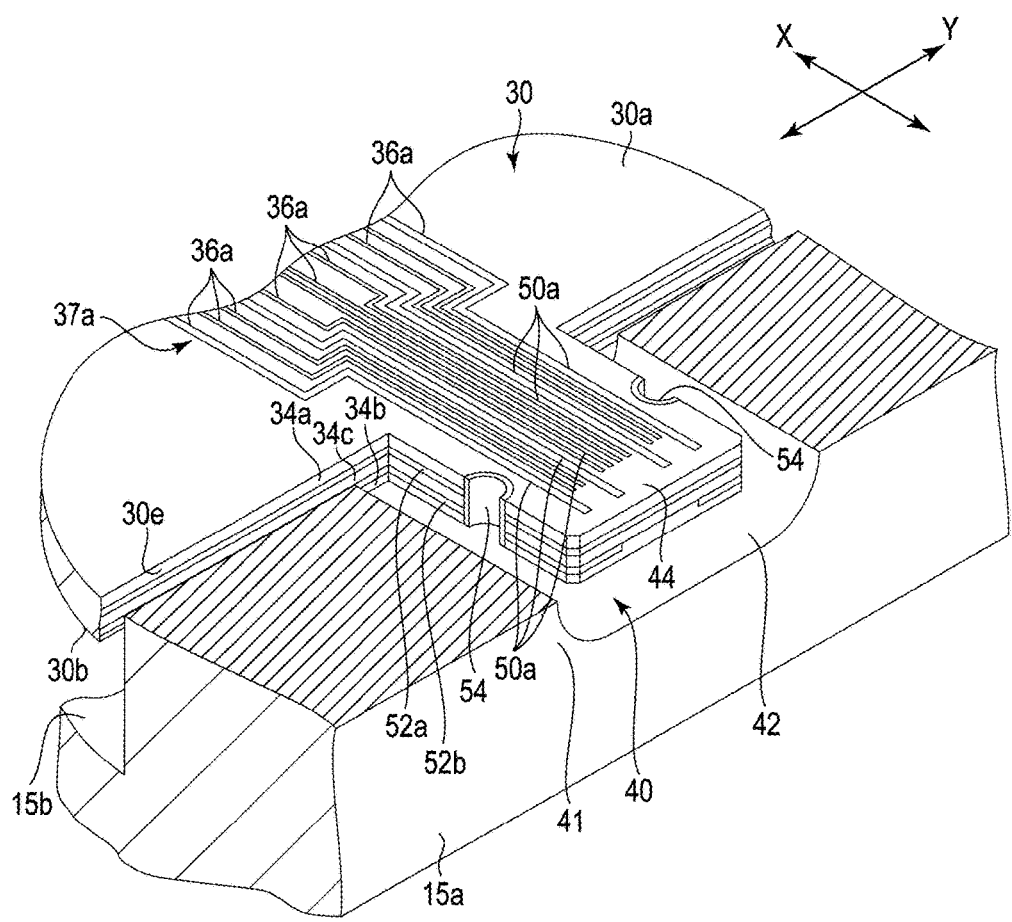
F I G. 3

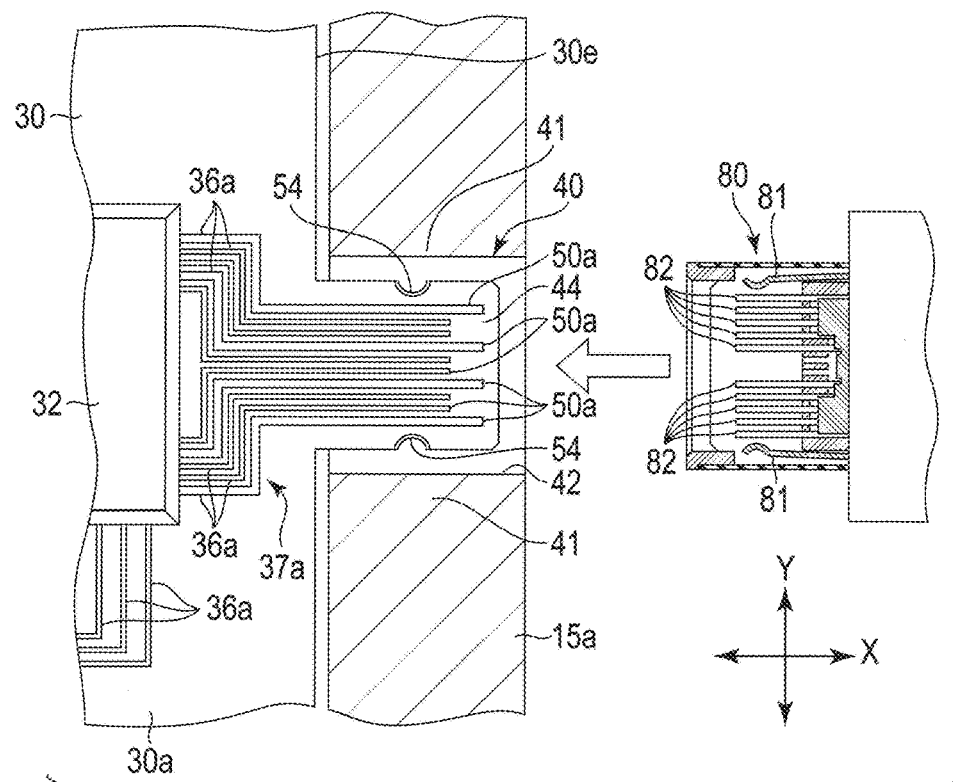
F I G. 4
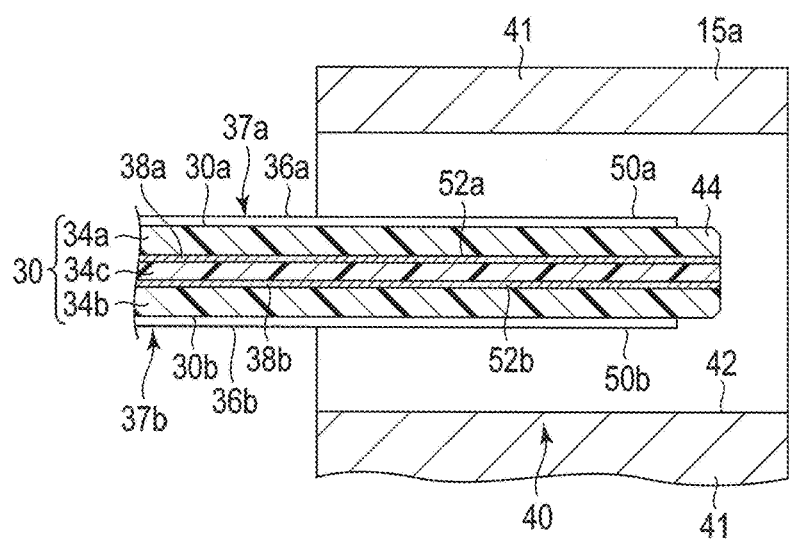
F I G. 5

ELECTRONIC DEVICE

CROSS-REFERENCE TO RELATED APPLICATIONS

This application is based upon and claims the benefit of priority from Japanese Patent Application No. 2017-061657, filed Mar. 27, 2017, the entire contents of which are incorporated herein by reference.

FIELD

Embodiments described herein relate generally to an electronic device.

BACKGROUND

An electronic device such as a notebook personal computer, a tablet computer or a smartphone comprises a housing forming an outer wall, a printed circuit board provided in the housing, various electronic components mounted on the printed circuit board, etc. These electronic components partially include connectors having various forms for connection to external devices. A USB connector (receptacle) is known as a typical example of connectors. The USB connector normally comprises a tubular shell (outer wall) formed of metal, and a plurality of connection terminals provided in the shell. The shell is mounted on the printed circuit board. The connection terminals are electrically connected to the wiring pattern of the printed circuit board by soldering, etc.

Recently, a USB Type-C connector has been suggested. The USB Type-C connector can be connected by standardizing the conventional USB Type-A and USB Type-B connecters, and transport video data and audio data as well as USB data. The USB Type-C connector is also dealt with as an independent electronic component comprising a tubular shell and a plurality of connection terminals provided in the shell. The USB Type-C connector is provided or mounted on the printed circuit board.

When, as described above, a plurality of electronic components including independent connectors are mounted on a printed circuit board, the number of components is increased. Thus, it is difficult to improve the assembling property and reduce the manufacturing cost.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exploded perspective view in which a part of a housing of the personal computer of FIG. 1 is disassembled.

FIG. 3 is a perspective view in which a connector portion related to the part of the housing of the personal computer of FIG. 2 is enlarged.

FIG. 4 is a plan view of the connector portion shown in FIG. 3.

FIG. 5 is a cross-sectional view of the connector portion shown in FIG. 4.

DETAILED DESCRIPTION

Figure 1:
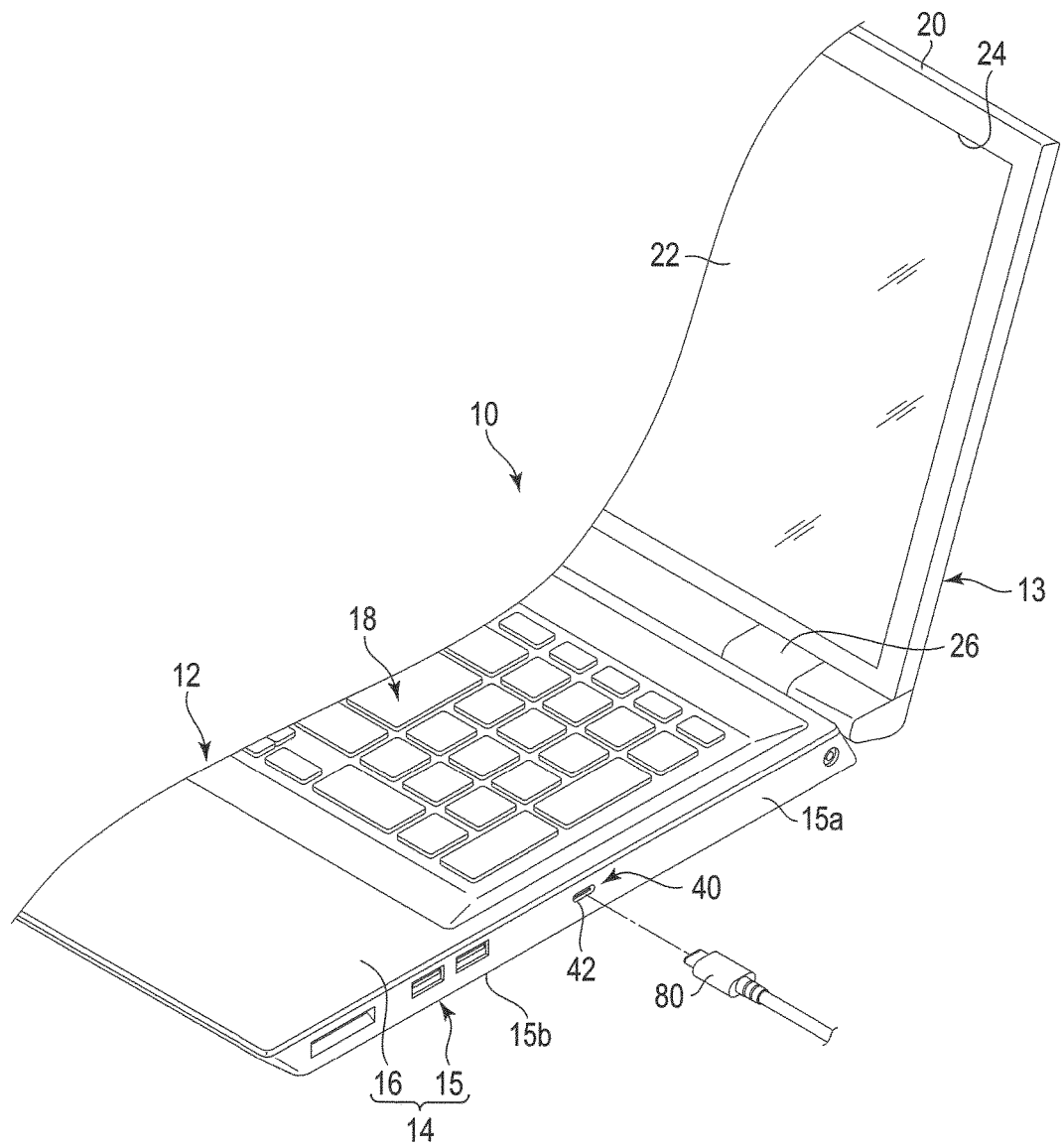
FIG. 1 is a perspective view showing a part of a personal computer according to a first embodiment.

Various embodiments will be described hereinafter with reference to the accompanying drawings. In general, according to one embodiment, an electronic device comprises a housing comprising a wall portion, a printed circuit board comprising a plurality of lines and provided in the housing, and a connector including a part of the housing and a part of the printed circuit board. The connector comprises an engagement hole formed in the wall portion of the housing and into which a connector plug is inserted. The connector further comprises a shell including a portion located around the engagement hole in the wall portion, a tongue portion including a part of the printed circuit board and provided in the engagement hole, and connection terminals formed with the lines extending to and on a top surface of the tongue portion.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

There will now be described in detail an electronic device according to a first embodiment. The present embodiment shows a notebook personal computer (hereinafter, referred to as a personal computer) as an example of the electronic device. FIG. 1 is a perspective view showing a part of the personal computer according to the first embodiment.

As shown in FIG. 1, the personal computer 10 comprises a main unit 12, and a display unit 13 supported on the main unit 12. The main unit 12 comprises a housing 14. The housing 14 comprises a base 15. The base 15 integrally comprises a rectangular bottom wall 15b and a plurality of sidewalls (wall portions) 15a provided upright along the side edges of the bottom wall 15b. The housing 14 further comprises a top cover 16 fitted to the base 15. The housing 14 is formed in a shape of a flat box as a whole. With regard to the housing 14, at least the base 15 is formed of metal such as aluminum or magnesium.

A substantially rectangular recess portion is formed in the central portion and the posterior portion of the top cover 16. A keyboard 18 is provided in the recess portion. The display unit 13 comprises a display housing 20 which is flat and rectangular, and a display panel 22 housed in the display housing 20. A display window (opening) 24 is formed on the front surface of the display housing 20. The display screen of the display panel 22 is exposed to the outside of the display housing 20 through the window 24.

The display housing 20 is rotatably supported on the housing 14 through a leg portion 26 and a hinge (not shown). Thus, the display unit 13 is rotatable between a closed position at which the display unit 13 is closed so as to cover the upper surface of the housing 14 including the keyboard 18 from above and an open position at which the display unit 13 is upright so as to expose the upper surface of the housing 14 and the display panel 22. FIG. 1 shows the personal computer 10 in which the display unit 13 is located at an open position after rotation.

FIG. 2 is an exploded perspective view showing the housing of the personal computer 10. As shown in FIG. 2, the main unit 12 comprises a main printed circuit board (motherboard; not shown), a sub-printed circuit board 30, and other electronic components (not shown), which are provided in the housing 14. The sub-printed circuit board 30 is provided on the bottom wall 15b of the base 15. The sub-printed circuit board 30 comprises a side edge 30e adjacent to and facing the inner surface of the sidewall 15a of the base 15 and extending in substantially parallel with the sidewall 15a. Various electronic components including a semiconductor element 32 are mounted on the sub-printed circuit board 30.

The main unit 12 comprises a connector 40 constructed by a part of the housing 14 and a part of the sub-printed circuit board 30. In the present embodiment, for example, the connector 40 is a USB Type-C female connector (receptacle).

Figure 6:
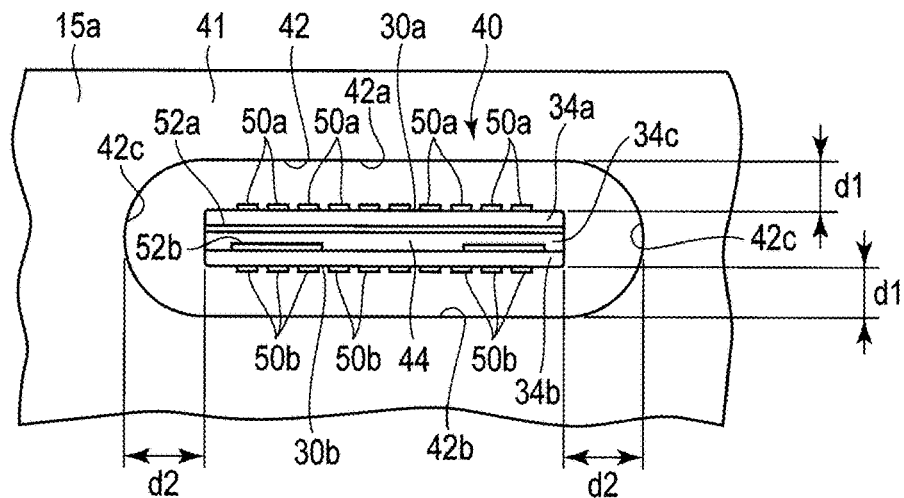
FIG. 6 is a front view of the connector portion when it is viewed from the external surface side of the housing shown in FIG. 4.

FIG. 3 is a perspective view in which the connector 40 and its peripheral portion are enlarged. FIG. 4 is a plan view showing the connector 40 and its peripheral portion shown in FIG. 3 by cutting a part of the sidewall. FIG. 5 is a cross-sectional view of the connector 40 and its peripheral portion shown in FIG. 4. FIG. 6 is a front view of the connector 40 and its peripheral portion when they are viewed from the external surface side of the sidewall.

As shown in FIGS. 2 to 6, an engagement hole (through-hole) 42 penetrates a part of the housing 14, for example, the sidewall 15a. The engagement hole 42 penetrates the sidewall 15a perpendicularly to the sidewall 15a, and is open on the outer and inner surfaces of the sidewall 15a. As shown in FIG. 4, the shape and dimensions of the engagement hole 42 are determined such that a connector plug 80 can be inserted into the engagement hole 42. When the connector plug 80 is a USB Type-C connector plug, the cross-section of the engagement hole 42 has an oval shape or a track-shape. As shown in FIG. 6, the cross-section of the engagement hole 42 comprises linear upper and lower edges 42a and 42b extending in parallel with the longitudinal direction of the sidewall 15a, and two arc-shaped side edges 42c connected to the upper and lower edges 42a and 42b. As shown in FIG. 2 to FIG. 6, of the sidewall 15a, a portion located around the engagement hole 42 forms a shell (outer shell) 41 of the connector 40.

As shown in FIG. 2 to FIG. 6, the sub-printed circuit board 30 integrally comprises a tongue portion 44 projecting from the side edge 30e and shaped in a rectangular plate. The tongue portion 44 constituting a part of the connector 40 is inserted into the engagement hole 42, and extends to the vicinity of the opening of the outer surface of the sidewall 15a. The shape and dimensions of the tongue portion 44 are determined such that the tongue portion 44 can engage with the connector plug 80. The tongue portion 44 is provided in substantially the central portion of the engagement hole 42, and faces the inner surface of the engagement hole 42 across an intervening space. As shown in FIG. 6, in the engagement hole 42, the tongue portion 44 is parallel to the long axis of the engagement hole 42. The interval between a first surface of the tongue portion 44 and the inner surface of the engagement hole 42 is equal to the interval between a second surface of the tongue portion 44 and the inner surface of the engagement hole 42. These intervals are defined as intervals d1. The interval between one of the two side edges of the tongue portion 44 and the inner surface of the engagement hole 42 is equal to the interval between the other side edge of the tongue portion 44 and the inner surface of the engagement hole 42. These intervals are defined as intervals d2.

The sub-printed circuit board 30 including the tongue portion 44 is a multilayer circuit board, for example, a four-layered circuit board. As shown in FIGS. 3, 4, and 6, the sub-printed circuit board 30 comprises a first insulating substrate 34a comprising a conductive layer on each surface, and a second insulating substrate 34b comprising a conductive layer on each surface. The first insulating substrate 34a and the second insulating substrate 34b are stacked via a third insulating substrate 34c. A conductive layer (for example, copper foil) formed on a first surface (upper surface) 30a of the sub-printed circuit board 30 is patterned so as to form a wiring pattern 37a including a plurality of lines 36a as shown in FIGS. 3 and 4. Similarly, a conductive layer (for example, copper foil) formed on a second surface (lower surface) 30b of the sub-printed circuit board 30 is patterned so as to form a wiring pattern 37b including a plurality of lines 36b. At least a part of two conductive layers 38a and 38b provided inside the sub-printed circuit board 30 forms a ground layer. The two conductive layers 38a and 38b may be connected to each other.

As shown in FIGS. 3 to 6, the tongue portion 44 of the sub-printed circuit board 30 comprises the first surface 30a and the second surface 30b opposite to the first top surface 30a. The lines 36a of the sub-printed circuit board 30 extend to an area on the first surface 30a of the tongue portion 44, and form first connection terminals 50a of the connector 40, respectively. The number of first connection terminals 50a is more than one, for example, twelve. The first connection terminals 50a extend from the proximal end of the tongue portion 44 to the vicinity of the extended end of the tongue portion 44 in the axial direction X of the tongue portion 44. The first connection terminals 50a are arranged in parallel with each other at predetermined intervals in the width direction Y of the tongue portion 44. Some or all of the lines 36a forming the first connection terminals 50a are electrically connected to the semiconductor element 32 of the sub-printed circuit board 30.

The lines 36b provided on the second surface 30b of the sub-printed circuit board 30 extend to an area on the second surface 30b of the tongue portion 44a, and form second connection terminals 50b of the connector 40, respectively. The number of second connection terminals 50b is more than one, for example, twelve. The second connection terminals 50b extend from the base end of the tongue portion 44 to the vicinity of the extension end of the tongue portion 44 in the axial direction X of the tongue portion 44. The second connection terminals 50b are arranged in parallel with each other at predetermined intervals in the width direction Y of the tongue portion 44. As shown in FIG. 6, the first connection terminals 50a and the second connection terminals 50b are symmetrically located and formed. Some or all of the lines 36b forming the second connection terminals 50b are electrically connected to a semiconductor element (not shown) mounted on the second top surface 30b of the sub-printed circuit board 30.

As shown in FIG. 5, the two conductive layers 38a and 38b provided in the intermediate layer of the sub-printed circuit board 30 extend inside the tongue portion 44, and form ground layers 52a and 52b of the connector 40, respectively. In the tongue portion 44, the two ground layers 52a and 52b may be electrically connected to each other, or may be independent ground layers. In the present embodiment, the ground layers 52a and 52b are provided on substantially the entire surface of the tongue portion 44, and are exposed to the two side surfaces and the end surface of the tongue portion 44. The number of ground layers is not limited to two. At least one ground layer should be provided.

As shown in FIGS. 3 and 4, a pair of through-holes 54 is provided on the two side edge portions of the tongue portion 44 such that one through-hole 54 is provided on each side edge of the tongue portion 44. A conductive layer is formed on the inner surface of each through-hole 54. The conductive layers are connected to the ground layers 52a and 52b explained in FIG. 3. Each through-hole 54 constitutes an engagement recess configured to engage with (or fit in) a corresponding ground terminal (hook) 81 of the connector plug 80 when the connector plug 80 is inserted into the through-holes 54.

As shown in FIG. 4, when the connector plug 80 is connected to the connector 40 having the above structure, the connector plug 80 is inserted into the engagement hole 42, and engages with the tongue portion 44 of the connector 40. A pair of ground terminals 81 of the connector plug 80 engages with a pair of engagement recesses of the through-holes 54 of the tongue portion 44. Thus, the ground terminals 81 are connected to the ground layers 52a and 52b of the tongue portion 44. The connector plug 80 comprises a plurality of connection terminals 82 each in direct contact with and connected to the first and second connection terminals 50a and 50b of the tongue portion 44. Note that each connection terminal 82 of the connector plug 80 may be configured to be in direct contact with only the first connection terminals 50a or only the second connection terminals 50b. Since the first connection terminals 50a and the second connection terminals 50b are symmetrically provided, the connector plug 80 may be connected upside down.

In the personal computer 10 having the above structure, the connector 40 is formed of a part of the housing and a part of the printed circuit board. Thus, a connector as an independent electronic component can be omitted. In this way, it is possible to reduce the number of components of the personal computer 10 and the manufacturing cost. Furthermore, the lines (conductive layers) of the printed circuit board are used to constitute the connection terminals of the connector 40. Thus, it is possible to eliminate connective portions such as soldered portions between the connection terminals and the lines. In this manner, the transmission loss of signals can be reduced. It is possible to realize high-speed transmission in comparison with the conventional art.

In the first embodiment, the housing is formed of metal. However, the material of the housing is not limited to this example. The housing may be formed of other materials such as synthetic resin as long as the housing can maintain sufficient strength. The connector 40 is not limited to a USB Type-C connector, and may be a different type of connector such as a USB Type-B connector or a Mini-USB connector.

The shape of the engagement hole 42 is not limited to an oval shape, and may be modified in various ways based on the type of the applied connector, such as a rectangular shape. The layout and shape of the connection terminals may be modified in various ways based on the type of the applied connector. For example, the connection terminals may be provided on only one side of the tongue portion 44.

Now, this specification explains the electronic device according to modification examples, and electronic devices according to other embodiments. In the modification examples and embodiments described below, the same elements as those of the first embodiment are denoted by the same reference numbers, and the detailed explanation of the elements is omitted or simplified. Thus, elements different from those of the first embodiment are mainly explained.

First Modification Example

Figure 7:
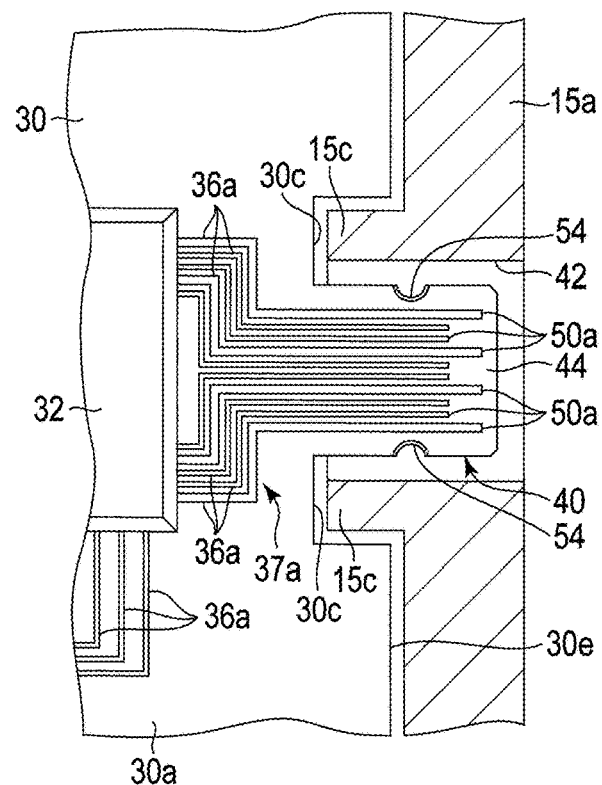
FIG. 7 is a plan view showing a connector of an electronic device according to a first modification example.

FIG. 7 is a plan view showing the connector portion of the electronic device according to a first modification example.

In the first modification example, the sidewall 15a of the housing is thinner than that of the first embodiment. The sidewall 15a integrally comprises tubular convex portion 15c projecting to the printed circuit board 30 side. Of the sidewall 15a, a portion located around the engagement hole 42 and the convex portion 15c form the shell 41 of the connector 40.

Two notches (or slits) 30c are formed in the side edge 30e of the printed circuit board 30. The tongue portion 44 is provided between the two notches 30c, and extends inside the engagement hole 42 from the bottom sides of the notches 30c. The convex portion 15c of the sidewall 15a is provided inside the notches 30c of the printed circuit board 30. The other structures of the tongue portion 44 are the same as those of the first embodiment.

Second Modification Example

Figure 8:
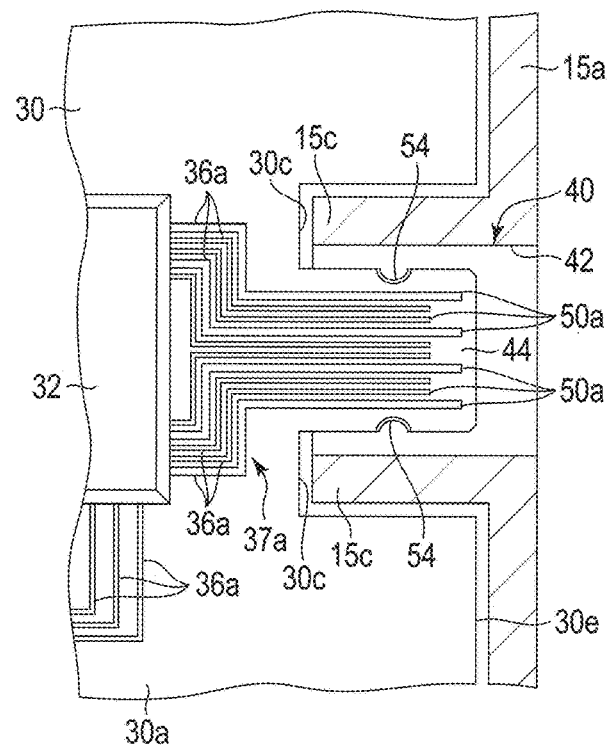
FIG. 8 is a plan view showing the connector of the electronic device according to a second modification example.

FIG. 8 is a plan view showing the connector portion of the electronic device according to a second modification example.

In the second modification example, the sidewall 15a of the housing is thinner than that of the first modification example. In this case, the projection of the convex portions 15c of the sidewall 15a is increased. In addition, the notches (or slits) 30c of the printed circuit board 30 are deeper than those of the first modification example. The tongue portion 44 is provided between the notches 30c and the extended end of the tongue portion 44 is flush with the side edge 30e of the printed circuit board 30 without projecting from the side edge 30e. The other structures of the tongue portion 44 are the same as those of the first embodiment.

Second Embodiment

Figure 9:
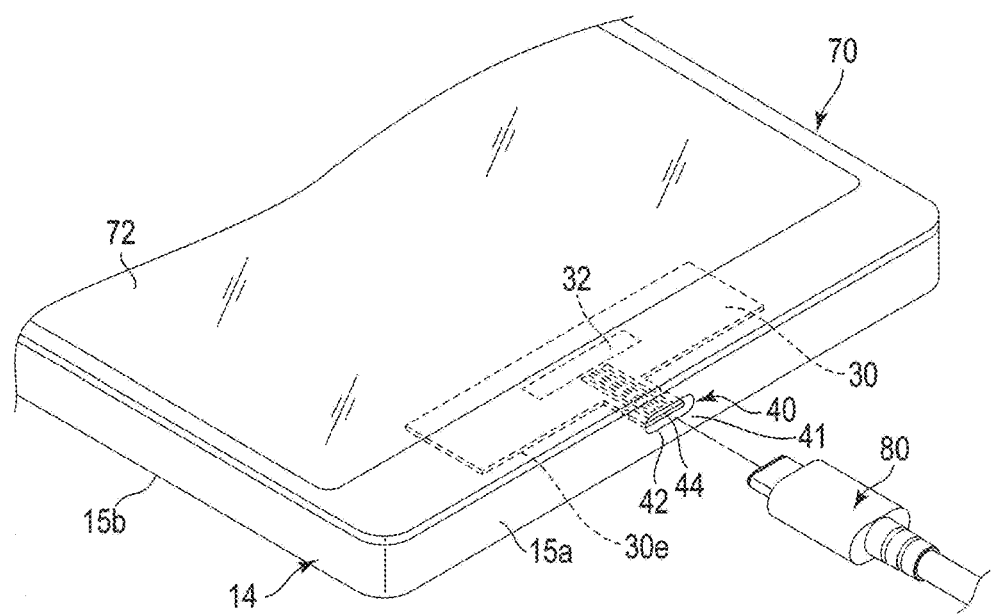
FIG. 9 is a perspective view showing an electronic device according to a second embodiment.

FIG. 9 is a perspective view showing an electronic device according to a second embodiment. The second embodiment shows a smartphone (mobile phone) as an example of the electronic device.

As shown in FIG. 9, the smartphone 70 comprises a display panel 72, a housing 14 supporting the display panel 72, and a printed circuit board 30 provided in the housing 14. The housing 14 is formed of metal such as aluminum integrally with a bottom wall 15b facing the display panel 72, and a plurality of sidewalls 15a provided upright along the peripheral border of the bottom wall 15b.

The printed circuit board 30 is provided on the bottom wall 15b of the housing 14. The printed circuit board 30 comprises a side edge 30e adjacent to and facing the inner surface of the sidewall 15a and extending in substantially parallel with the sidewall 15a. Various electronic components including a semiconductor element 32 are mounted on the printed circuit board 30.

The smartphone 70 comprises a connector 40 formed of a part of the housing 14 and a part of the printed circuit board 30. The connector 40 is, for example, a USB Type-C female connector (receptacle).

An engagement hole (through-hole) 42 penetrates a part of the housing 14, for example, the sidewall 15a. The engagement hole 42 penetrates the sidewall 15a perpendicularly to the sidewall 15a, and is open on the outer and inner surfaces of the sidewall 15a. The shape and dimensions of the engagement hole 42 are determined such that a connector plug 80 can be inserted into the engagement hole 42. Of the sidewall 15a, a portion located around the engagement hole 42 forms a shell 41 of the connector 40.

The printed circuit board 30 integrally comprises a tongue portion 44 projecting from the side edge 30e and shaped in a rectangular plate. The tongue portion 44 is inserted into the engagement hole 42, and extends to the vicinity of the opening of the outer surface of the sidewall 15a. The shape and dimensions of the tongue portion 44 are determined such that the tongue portion 44 can engage with the connector plug 80. The tongue portion 44 forms the tongue portion of the connector 40. The other structures of the tongue portion 44, the connector 40 and the printed circuit board 30 are the same as those of the tongue portion 44, the connector 40 and the sub-printed circuit board 30 of the first embodiment.

In the smartphone 70 having the above structure, an independent connector can be omitted. Thus, the number of components and the manufacturing cost can be reduced. Furthermore, in a flat electronic device such as a smartphone, the thickness can be further reduced by omitting an independent connector.

Third Embodiment

Figure 10:
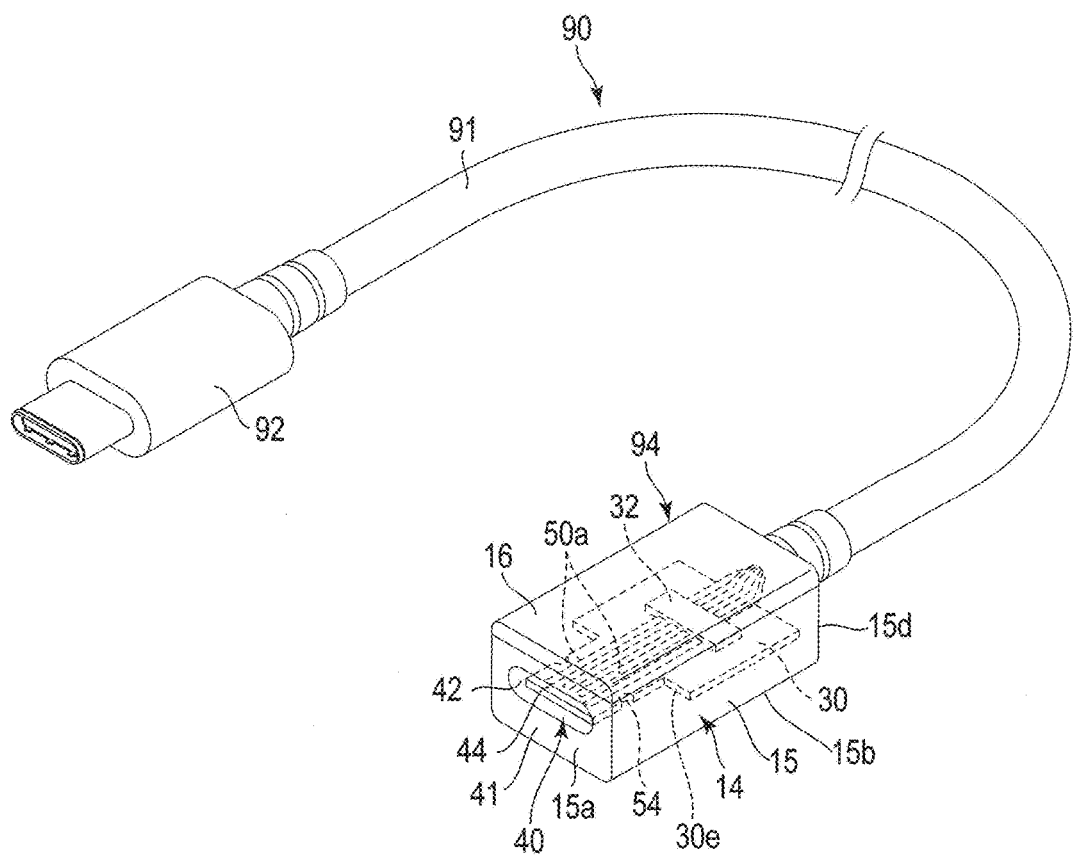
FIG. 10 is a perspective view showing an electronic device according to a third embodiment.

FIG. 10 is a perspective view showing an electronic device according to a third embodiment. The third embodiment shows a connective cable, such as a conversion adapter cable, as an example of the electronic device.

As shown in FIG. 10, the connective cable 90 comprises a cable 91, a connector plug 92 connected to an end of the cable 91, and an adapter 94 connected to the other end of the cable 91. The adapter 94 comprises a housing 14, a printed circuit board 30 provided in the housing 14, and a connector 40 formed of a part of the housing 14 and a part of the printed circuit board 30.

The housing 14 comprises a base 15. The base 15 integrally comprises a bottom wall 15b, and a plurality of sidewalls 15a and 15d provided upright along the peripheral border of the bottom wall 15b. The housing 14 further comprises a cover 16 secured to the sidewalls 15a and 15d and facing the bottom wall 15b.

The printed circuit board 30 is provided on the bottom wall 15b of the housing 14. The printed circuit board 30 comprises a side edge 30e adjacent to and facing the internal surface of the sidewall 15a and extending in substantially parallel with the sidewall 15a. The other side edge of the printed circuit board 30 is adjacent to and faces the internal surface of the sidewall 15d. Various electronic components including a semiconductor element 32 are mounted on the printed circuit board 30. The other end of the cable 91 passes through the sidewall 15d and is connected to the printed circuit board 30.

An engagement hole (through-hole) 42 penetrates a part of the housing 14, for example, the sidewall 15a. The engagement hole 42 is open on the outer and inner surfaces of the sidewall 15a. The shape and dimensions of the engagement hole 42 are determined such that a connector plug (not shown) can be inserted into the engagement hole 42. Of the sidewall 15a, a portion located around the engagement hole 42 forms a shell 41 of the connector 40.

The printed circuit board 30 integrally comprises a tongue portion 44 projecting from the side edge 30e and shaped in a rectangular plate. The tongue portion 44 is provided in the engagement hole 42, and forms the tongue portion of the connector 40. The shape and dimensions of the tongue portion 44 are determined such that the tongue portion 44 can engage with the connector plug. The other structures of the tongue portion 44, the connector 40 and the printed circuit board 30 are the same as those of the tongue portion 44, the connector 40 and the sub-printed circuit board 30 of the first embodiment.

In the connective cable 90 having the above structure, an independent connector can be omitted. Thus, the number of components and the manufacturing cost can be reduced. Furthermore, the size of the adapter can be reduced by omitting an independent connector.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An electronic device is not limited to a personal computer, a smartphone, and a connective cable, and a television receiver, a tablet computer, and various other electronic devices comprising a housing and a printed circuit board may be applied. The materials, shapes and dimensions of the components of the electronic device are not limited to the above embodiments, and may be modified in various ways as necessary.

What is claimed is:

1. An electronic device comprising: a housing comprising a wall portion formed with an engagement hole; a printed circuit board including a first top flat surface, a second bottom flat surface, and a wiring pattern comprising a plurality of lines and provided in the housing; a tongue portion formed of a part of the printed circuit board and flush with the first top flat surface and the second bottom flat surface, and provided in the engagement hole; and a connector formed of the engagement hole and the tongue portion in the engagement hole, and into which a connecter plug is to be inserted, wherein some parts of the lines of the printed circuit board extend on a surface of the tongue portion and constitute connection terminals of the connector; a ground layer is formed in the printed circuit board and exposed to side surfaces and a distal end surface of the tongue portion and the tongue portion comprises a through-hole formed in each of the side surfaces to constitute an engagement recess configured to engage and ground with the connector plug, and the grand layer is exposed to the engagement recess to be connectable to a ground terminal of the connector plug.

2. The electronic device of claim 1, wherein
the tongue portion comprises a first surface and a second surface opposing the first surface, and
the connection terminals comprise:
a plurality of first connection terminals formed of the lines extending on the first surface of the tongue portion; and
a plurality of second connection terminals formed of the lines extending on the second surface of the tongue portion.

3. The electronic device of claim 2, wherein
the first connection terminals and the second connection terminals are symmetrically provided.

4. The electronic device of claim 3, wherein
the tongue portion is located in the engagement hole such that a certain space is defined around the tongue portion.

5. The electronic device of claim 4, wherein
the printed circuit board comprises a side edge facing an internal surface of the wall portion, and
the tongue portion projects from the side edge into the engagement hole.

* * * * *